(12) United States Patent
Frohne et al.

(10) Patent No.: US 11,555,843 B2
(45) Date of Patent: Jan. 17, 2023

(54) METHOD AND SYSTEM FOR LOCALIZING A SHORT CIRCUIT BETWEEN A CONDUCTOR AND AN ELECTRICALLY CONDUCTIVE SHIELD SURROUNDING SAID CONDUCTOR

(71) Applicant: NEXANS, Courbevoie (FR)

(72) Inventors: Christian Frohne, Hannover (DE); Volker Gauler, Wedemark (DE); Younes Norouzi, Hannover (DE); David Dubois, Clerques (FR)

(73) Assignee: NEXANS, Courbevoie (FR)

( * ) Notice: Subject to any disclaimer, the term of this patent is extended or adjusted under 35 U.S.C. 154(b) by 0 days.

(21) Appl. No.: 17/689,750

(22) Filed: Mar. 8, 2022

(65) Prior Publication Data
US 2022/0334164 A1 Oct. 20, 2022

Related U.S. Application Data

(63) Continuation of application No. 16/998,620, filed on Aug. 20, 2020, now abandoned.

(51) Int. Cl.
| | | |
|---|---|---|
| *G01R 31/08* | (2020.01) | |
| *G01R 31/52* | (2020.01) | |
| *H02H 7/26* | (2006.01) | |

(52) U.S. Cl.
CPC ......... *G01R 31/083* (2013.01); *G01R 31/088* (2013.01); *G01R 31/52* (2020.01); *H02H 7/261* (2013.01)

(58) Field of Classification Search
CPC .... G01R 31/083; G01R 31/088; G01R 31/52; G01R 19/165; G01R 19/2513; H02H 7/261

(Continued)

(56) References Cited

U.S. PATENT DOCUMENTS 9,983,250 B2 * 5/2018 Barber ................... G01R 31/52

FOREIGN PATENT DOCUMENTS

| CN | 109 031 021 | 12/2018 |
| CN | 109 738 763 | 5/2019 |

(Continued)

OTHER PUBLICATIONS

International Search Report dated Mar. 23, 2020.

*Primary Examiner* — Farhana A Hoque
(74) *Attorney, Agent, or Firm* — Sofer & Haroun, LLP

(57) ABSTRACT

A method for localizing a short circuit between a conductor and an electrically conductive shield of a high-voltage cable comprises providing at least two measuring apparatuses arranged at the high-voltage cable at a known distance from one another and having timers, synchronized with one another, and a measuring device for detecting an electric current flowing in the shield and/or an earthing line connecting the shield and earth. The measuring apparatus transmits pairs of current measurement values and associated values of the timer to an analysis unit, which, upon the occurrence of a current exceeding a threshold value and/or of a current profile over time that satisfies specific stipulations, feeds to a calculation unit the associated values of the timers and also an indication about the location of the measurement, for which first effects of the short circuit occurred. The calculation unit calculates the location of a short circuit from the known distance between the measuring apparatuses and a difference between the values of the synchronized timers.

10 Claims, 4 Drawing Sheets

(58) Field of Classification Search
USPC .......................................................... 324/523
See application file for complete search history.

(56) References Cited

FOREIGN PATENT DOCUMENTS

| | | |
|---|---|---|
| DE | 44 16 966 | 11/1995 |
| JP | 2015 230289 | 12/2015 |

* cited by examiner

METHOD AND SYSTEM FOR LOCALIZING A SHORT CIRCUIT BETWEEN A CONDUCTOR AND AN ELECTRICALLY CONDUCTIVE SHIELD SURROUNDING SAID CONDUCTOR

RELATED APPLICATION

This application is a continuation application of U.S. patent application Ser. No. 16/998,620, filed on Aug. 20, 2020, which in turn claims the benefit of priority from European Patent Application No. 19 306 045.6, filed on Aug. 29, 2019, the entirety of which are incorporated by reference.

FIELD OF THE INVENTION

The invention relates to a system and a method for localizing short circuits between an electrical conductor of a high-voltage power cable and an electrically conductive shield surrounding the electrical conductor. The invention additionally relates to a transmission link for electrical energy having a system according to the invention, and also a measuring apparatus for use in the system according to the invention.

BACKGROUND

High-voltage power cables are generally used for the transmission of electrical energy where overhead lines or gas-insulated transmission lines cannot be used. They are preferably used in long lengths for submarine power cables and high-voltage direct current transmission links. High-voltage power cables comprise a live electrical conductor, which carries the current and which is surrounded by an electrical insulation. The electrical insulation is in turn surrounded by an electrically conductive shield, which is connected to earth singly or multiply usually at both ends and optionally along the link. The electrically conductive shield can be a metallic shield, for example, which can moreover additionally afford mechanical protection of the insulation.

High-voltage power cables can be transported in one piece only to a specific maximum length, which is determined inter alia by the weight and the diameter of a cable drum or cable reel that takes up the cable. Maximum weight and diameter are dependent on the available means of transport and the transport paths to be used. In order to lay power cables over relatively great distances, it is therefore necessary for a plurality of power cables to be conductively connected to one another. This is done using special connection kits that connect together the conductors and the electrically conductive shields of two cable segments of a transmission link for electrical energy. In order to prevent relatively high voltages from arising on the electrically conductive shield during operation, it is possible for the shields not only to be connected to one another, but also to be connected to earth, at the respective connection points.

The electrical insulation between the electrical conductor and the electrically conductive shield can fail for a variety of reasons, for instance in the case of an excessively high voltage, as a result of external mechanical damage or as a result of so-called "electrical treeing". Electrical treeing describes damage to the insulation on account of partial discharges, said damage preceding a breakdown of a solid insulating layer and progressing slowly through the insulating layer and in the process forming paths that resemble the branches of a tree. Electrical treeing occurs preferentially at points of an insulation which have impurities or bubbles in the insulating material or which have been or are subjected to mechanical loads.

Failure of the electrical insulation is manifested as a more or less low-resistance short circuit between the electrical conductor and the electrically conductive shield. Since the shield is connected to earth with comparatively low resistance at the ends of the transmission link, a current flows from the conductor via the short circuit to the shield and via the shield to earth. In this case, the current flows from the location of the short circuit to the two earthed ends of the shield, the current on each side of the short circuit being dependent on the impedance of the cable link.

The point in time of the failure of the electrical insulation and primarily the location of the failure cannot be predicted with certainty. Although there are methods for checking the state of the cable link, e.g. measuring the loss factor or the partial discharges, they usually require deactivation of the cable link, that is to say that the cable link cannot transmit energy during the time of the check. Moreover, very accurate localization of incipient or advanced damage to the insulation is not possible even with the known methods.

If a breakdown of the insulation has occurred, the defective point of the cable must be repaired or replaced. For this purpose, it is necessary to know where the exact location of the fault is situated, i.e. at what distance from an end of the cable or in which segment of a cable, because the cables are generally buried in the ground, and excavating the cable over its entire length is ruled out if only for cost reasons.

Taking this as a departure point, the present invention has the object of providing a method for localizing short circuits between the conductor and the shield or breakdowns in the insulation of high-voltage cables, which method localizes the fault during fault development in operation and affords a high accuracy. A further object of the invention is to provide a method that improves the accuracy of offline fault locating methods, wherein extraneous voltages for fault locating are fed in after the occurrence of the fault and after the cable link has been disconnected from the electrical grid.

SUMMARY OF THE INVENTION

In order to achieve this object, according to a first aspect, the invention proposes a method that uses the temporally delayed occurrence of effects of a short circuit at different distances from the location of the short circuit for localizing a short circuit between a conductor and an electrically conductive shield of a high-voltage cable, said shield surrounding said conductor. According to a second aspect, the invention proposes a measuring apparatus for detecting an electric current flowing in the electrically conductive shield of a high-voltage cable and/or an electric current flowing in an earthing line connecting the electrically conductive shield and earth, and for detecting the point in time of the occurrence of said electric current(s), said measuring apparatus being configured for application in the method in accordance with the first aspect. According to a third aspect, the invention proposes a system for localizing a short circuit between a conductor and an electrically conductive shield of a high-voltage cable, said shield surrounding said conductor, comprising two or more measuring apparatuses in accordance with the second aspect. Finally, according to a fourth aspect, the invention proposes a transmission link for electrical energy having a system for localizing a short circuit in accordance with the third aspect.

According to a further aspect, the aspects mentioned above can be used advantageously not only if the evaluatable signals are caused by the short circuit itself, but also if, following a fault in the cable, a signal fed in extraneously at the end of the cable passes along the cable and is evaluated according to the invention.

A method according to the first aspect for localizing a short circuit between a conductor and an electrically conductive shield of a high-voltage cable, said shield surrounding said conductor, comprises providing at least two measuring apparatuses arranged at the high-voltage cable in each case at a known distance from one another or from the ends of the high-voltage cable. The measuring apparatuses have timers, synchronized with one another, and also a measuring device for detecting a current flowing in the electrically conductive shield and/or a current flowing in an earthing line connecting the electrically conductive shield and earth. The method additionally comprises transmitting, cyclically for mutually adjacent time segments or continuously, pairs of current measurement values and associated values of the timer from the measuring device(s) to an analysis unit.

The pairs of current measurement values and associated values of the timer are expediently detected with a high sampling rate, for example every 0.5 μs or at even shorter time intervals.

A continuous transmission to the analysis unit presupposes a sufficiently fast data connection. In one embodiment, the analysis unit is therefore part of the measuring apparatus, such that fast internal connections between the units can be used.

A cyclic transmission of pairs of current measurement values and associated values of the timer can be advantageous e.g. if the analysis unit is not part of the measuring apparatus, but rather is used jointly by a plurality of measuring apparatuses. At least for the cyclic transmission, the pairs of current measurement values and associated values of the timer can be buffer-stored before they are transmitted collectively to the analysis unit. In order to minimize the volume of data to be transmitted, data compression methods can be used. In the analysis unit, the cyclically received data can be combined again to form a continuous measurement series, which is then analysed.

The analysis unit feeds to a calculation unit at least the value of the timer which was determined, after the occurrence of a current exceeding a threshold value and/or of a current profile over time that satisfies specific stipulations, as the point in time at which effects of a short circuit between the conductor and the electrically conductive shield surrounding the latter first occurred, and also the location of the measurement. If provision is made of a jointly used analysis unit for a plurality of measuring apparatuses, the analysis unit accordingly feeds to the calculation unit the values of the synchronized timers of the plurality of measuring apparatuses and the locations thereof. The location of the measurement need not be a geographical indication; it suffices to indicate a distance between the measurement location and a reference point on the high-voltage cable.

The threshold values can be defined individually for each measuring point, for example depending on the impedance of the earthing line at the relevant measuring point.

The analysis unit can evaluate the pairs of current measurement values and associated values of the timer by means of artificial intelligence or by means of machine learning methods that recognize typical current profiles over time that occur in the event of short circuits between the conductor and the electrically conductive shield. For this purpose, a multiplicity of typical reference current profiles over time can be provided. The analysis unit determines or ascertains therefrom a point in time at which effects of a short circuit between conductor and electrically conductive shield occurred at the respective measuring point. In a simpler configuration, the analysis unit can also carry out a simple pattern comparison between the multiplicity of reference current profiles over time and determine or ascertain therefrom the point in time at which first effects of a short circuit between conductor and electrically conductive shield occurred at the respective measuring point. The reference current profiles over time can be determined by simulations. In this case, it is conceivable to provide individual reference current profiles over time for each measuring apparatus in order thus to take account of properties of the cable and of the earthing line, for example.

The analysis unit can have a circular buffer, for example, which stores a series of pairs—detected with a high sampling rate—of current measurement values and values of the associated timer for an analysis, e.g. in order to be able to map the profile of the current for the analysis. As long as there is no indication of a short circuit at any point of the transmission link, e.g. no threshold value has been exceeded, new pairs of measurement values are stored in the circular buffer, and the oldest pairs in each case are removed. As soon as there is an indication of a short circuit, a specific number of further measurement values can also be stored in the circular buffer until there is a sufficient number of pairs of measurement values that map the current profile temporally before and after the short circuit. These data can then be analysed in more specific detail in order to determine the point in time of the first occurrence of effects of the short circuit at the measurement location. Owing to a response threshold that is necessary in order to avoid false alarms, the point in time of the first occurrence of effects may also precede the point in time at which the threshold value that triggers the analysis is exceeded. The temporal current profiles around the point in time of the fault can thus be used for improving the accuracy of the result, or for determining the severity of the fault, or the like. In principle, the continuous storage in a circular buffer can ensure the availability of data directly before the fault situation, which may be of interest for a more extensive evaluation.

The calculation unit calculates the location of a short circuit from the known distance or the known distances between the measuring apparatuses and a difference between the values of the synchronized timers that were determined or ascertained for the first occurrence of the effects of the short circuit between conductor and electrically conductive shield at the respective measuring apparatus, and outputs the calculated location. The finite speed of propagation of changes of the current in the electrically conductive shield is used for this purpose, said speed being dependent inter alia on the impedance of the shield. If a current that rises rapidly to a high value is impressed into a long cable or the shield thereof at an arbitrary point, the current will reach a comparable value at a point at a great distance from the infeed location only with a delay dependent on the impedance and the distance, inter alia because the current firstly charges the capacitance between conductor and shield, said capacitance being distributed over the length of the cable. The gradient of at least one portion of the rise of the current can decrease on account of the resistance of the electrically conductive shield and the inductance of the line at a distance from the infeed point. If the shields are connected to earth at connection points of segments of the cable, a portion of the current flowing in the shield can flow away there, such that a smaller current flows in the segment of the cable that is adjacent to the connection point. During measurements of the current in the earthing lines, it should additionally be taken into consideration that said earthing lines can have greatly deviating impedances in comparison with the impedance of the shield, such that the curve of the rise of the current over time can have a different profile in the earthing line than in the electrically conductive shield.

Accordingly, in one or more configurations of the method, values representing the impedance of the electrically conductive shield and/or of the earthing line connecting the electrically conductive shield and earth can be fed to the calculation unit for the calculation of the location.

In one or more configurations of the method, the timers of the measuring apparatuses are synchronized by means of the signals of a satellite navigation system, synchronization signals of a time signal transmitter for radio-controlled clocks, e.g. DCF77, MSF, WWV, WWVB, WWVH, and/or synchronization signals transmitted via a communication line connecting the measuring apparatuses. The synchronization can be effected cyclically at regular intervals or as required. In the case of synchronization by means of the signals of a time signal transmitter, it is possible to use the known distance between the transmitting antenna and the respective receiver for the correction of the time of flight of the signals. In the case of synchronization via a communication line connecting the measuring apparatuses, a high accuracy is achievable particularly with the use of optical transmission media; here, too, it is possible to use the known distance between the measuring apparatuses and to a central communication unit for the correction of the time of flight of the signals.

A measuring apparatus in accordance with the second aspect for detecting an electric current flowing in the electrically conductive shield of a high-voltage cable and/or an electric current flowing in an earthing line connecting the electrically conductive shield and earth comprises a current measuring device for detecting the current in the electrically conductive shield and/or in the earthing line. The current measuring device is expediently configured to detect the current with a high sampling rate, for example every 0.5 μs or at even shorter time intervals. The measuring apparatus additionally comprises a timer, which is synchronizable with timers of other measuring apparatuses. Furthermore, the measuring apparatus comprises a communication interface, which is configured for the transmission of measurement values to an analysis unit used by a plurality of measuring apparatuses, and/or a central calculation unit.

The communication interface can comprise for example a fibre-optic connection, a wireless communication connection or a network connection, wherein electrical signals are transmitted via corresponding lines. The communication interface can also be configured to forward data in each case via an adjacent measuring apparatus to the analysis unit or the calculation unit, such that a direct connection to the final receivers of the data is not required for all the measuring apparatuses.

In one embodiment, the measuring apparatus comprises an analysis unit, such that via the communication interface it is necessary to transmit to the central calculation unit only the value of the timer for the point in time for which the occurrence of a short circuit was established or determined. The location of the measurement can be stored in the calculation unit and be determined on the basis of the transmitter identification. If the location is not stored, the location of the measurement likewise has to be transmitted.

The measuring apparatus furthermore comprises one or a plurality of microprocessors and volatile and/or non-volatile memories assigned thereto, and also an energy supply.

A system in accordance with the third aspect for localizing a short circuit between a conductor and an electrically conductive shield of a high-voltage cable, said shield surrounding said conductor, comprises two or more measuring apparatuses in accordance with the second aspect arranged at the high-voltage cable at a known distance from one another or from the ends of the high-voltage cable, said measuring apparatuses having timers, synchronized with one another, and a measuring device for detecting an electric current flowing in the electrically conductive shield and/or an electric current flowing in an earthing line connecting the electrically conductive shield and earth. The measuring apparatuses are furthermore configured to transmit pairs of current measurement values and associated values of the timer cyclically for mutually adjacent time segments or continuously to an analysis unit.

In one configuration of the system, a corresponding analysis unit is provided for the measuring apparatuses. In another configuration of the system, an analysis unit is provided for a plurality of measuring apparatuses. In yet another configuration, some measuring apparatuses have a dedicated analysis unit, and others are connected to a jointly used analysis unit.

Each analysis unit is configured to analyse the transmitted pairs of current measurement values and associated values of the timer and, upon the occurrence of a current exceeding a threshold value or of a current profile over time that satisfies specific stipulations, to feed to a calculation unit of the system at least in each case the associated value of the timer which corresponds to the point in time at which first effects of the short circuit occurred at the location of the measurement. The exceedance of a threshold value for the measured current or a specific current profile over time can be interpreted e.g. as an indication of a short circuit between conductor and electrically conductive shield, whereupon the analysis unit optionally performs a correction calculation in order also to examine current profiles below the threshold value and to determine therefrom the point in time at which the effects of the short circuit occurred for the first time at the location of the measurement.

The calculation unit is configured to localize the location of the short circuit from the known distance between the measuring apparatuses and a difference between the fed values of the synchronized timers. The finite speed of propagation of changes of the current in the electrically conductive shield is used for this purpose, said speed being dependent inter alia on the impedance of the shield. Moreover, it is possible to feed to the calculation unit information about the locations and impedances of earthing lines arranged along the cable, said earthing lines connecting the shield to earth as input information for the calculation of the location of the short circuit.

A transmission link for electrical energy of high voltage comprises a high-voltage cable, which comprises an electrical conductor and an electrically conductive shield surrounding the latter. At the electrically conductive shield, two or more measuring apparatuses of a system according to the third aspect are arranged at a known distance from one another, said measuring apparatuses being configured to determine a point in time at which first effects of a short circuit between conductor and electrically conductive shield occurred at the location of the measuring apparatus. The measuring apparatuses are communicatively connected to a calculation unit of the system, which calculation unit, in the case of a short circuit, determines and outputs the location thereof on the cable.

In a further aspect, the invention can increase the accuracy of an offline measurement, wherein extraneous voltages and/or extraneous currents for fault locating are fed in after the occurrence of the fault and after the cable link has been disconnected from the electrical grid. In this regard, in a time domain reflectometry (TDR) measurement, for example, a voltage pulse is fed in at one end of the cable and propagates as an electromagnetic wave in the cable. Said pulse can be identified as voltage between conductor and shield, but also as current in the conductor and current in the shield. In the conventional method, the voltage pulse is fed in, and the reflected voltage pulse is evaluated at the same location. This measurement is subject to the damping of the double passage from the infeed point to the fault location. In combination with the method according to the invention for localizing a short circuit between a conductor and an electrically conductive shield surrounding the latter and the corresponding evaluation, it is also possible to identify said pulse in direct proximity to the fault location in the measuring apparatuses. On account of the proximity of the evaluation to the fault location, it is possible to increase the accuracy of the TDR measurement by comparison with the conventional method, in which an evaluation is effected only at the infeed point.

BRIEF DESCRIPTION OF THE DRAWING

The invention is explained in greater detail by way of example below on the basis of an embodiment with reference to the accompanying figures. All the figures are purely schematic and not to scale. In the figures.

Identical or similar elements are provided with identical or similar reference signs in the figures.

DETAILED DESCRIPTION OF THE EXEMPLARY EMBODIMENTS

Figure 1:
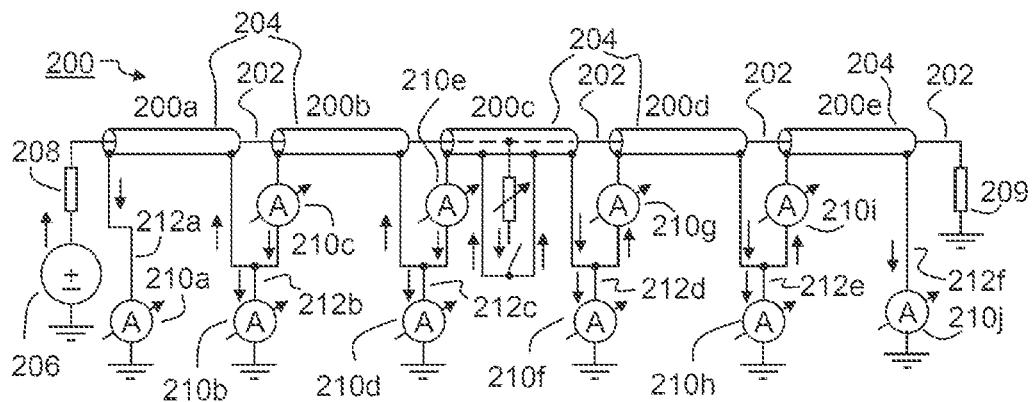
FIG. 1 shows a schematic illustration of current flows in a transmission link, consisting of a plurality of segments, for electrical energy with a short circuit between conductor and electrically conductive shield.

FIG. 1 shows a schematic illustration of the current flows in the electrically conductive shields of the segments and the earthing conductors connecting the shields and earth in a transmission link 200, consisting of a plurality of segments 200a-200e, for electrical energy with a short circuit between conductor 202 and electrically conductive shield 204 in segment 200c. In the figure, the transmission link is used for the transmission of direct current that is fed in from a DC source 206 with an internal resistance 208. A load resistance 209 is arranged at the other end of the transmission link. The flow direction of the currents is indicated by the arrows. Current measuring instruments 210a-210j are arranged at both ends of the transmission link 200 and at the connection points of the segments and measure the currents in the electrically conductive shield 204 or in the earthing lines 212a-212f connecting the shields 204 and earth. The distances between the points at which the currents are measured are likewise known owing to the known length of the cable segments.

Before the short circuit, only negligibly small currents flowed in the shields. From the moment when the short circuit occurs, comparatively high currents flow through the shields in the segments, the currents flowing according to the impedance of the shield on both sides of the short circuit. At each earthing point at a connection point of the shields, a portion of the current can flow away to earth, wherein the magnitude of the current flowing away to earth is dependent on the impedance of the earthing line. In general, the earthing lines are not designed to conduct away to earth a current of the order of magnitude of the rated current because normally only comparatively small currents flow in the shield. It can therefore happen that the majority of the short-circuit current can flow away to earth only at both ends of the transmission link.

Figure 2:
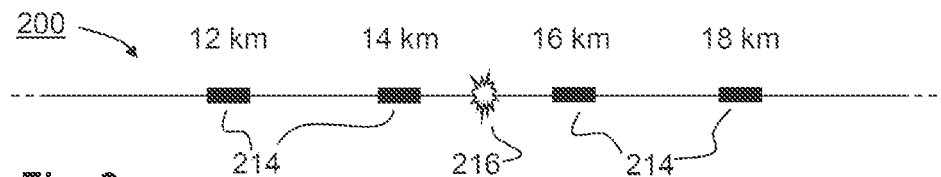
FIG. 2 shows a schematic illustration of an excerpt from a transmission link for electrical energy with connection points arranged at a distance of 2 km and with a short circuit between the conductor and the electrically conductive shield, FIG. 3 a)-d) show temporal profiles of the currents in the electrically conductive shield at the connection points, FIG. 4 a)-d) show temporal profiles of the currents in earthing lines connecting the electrically conductive shield and earth at the connection points.
Figure 3:
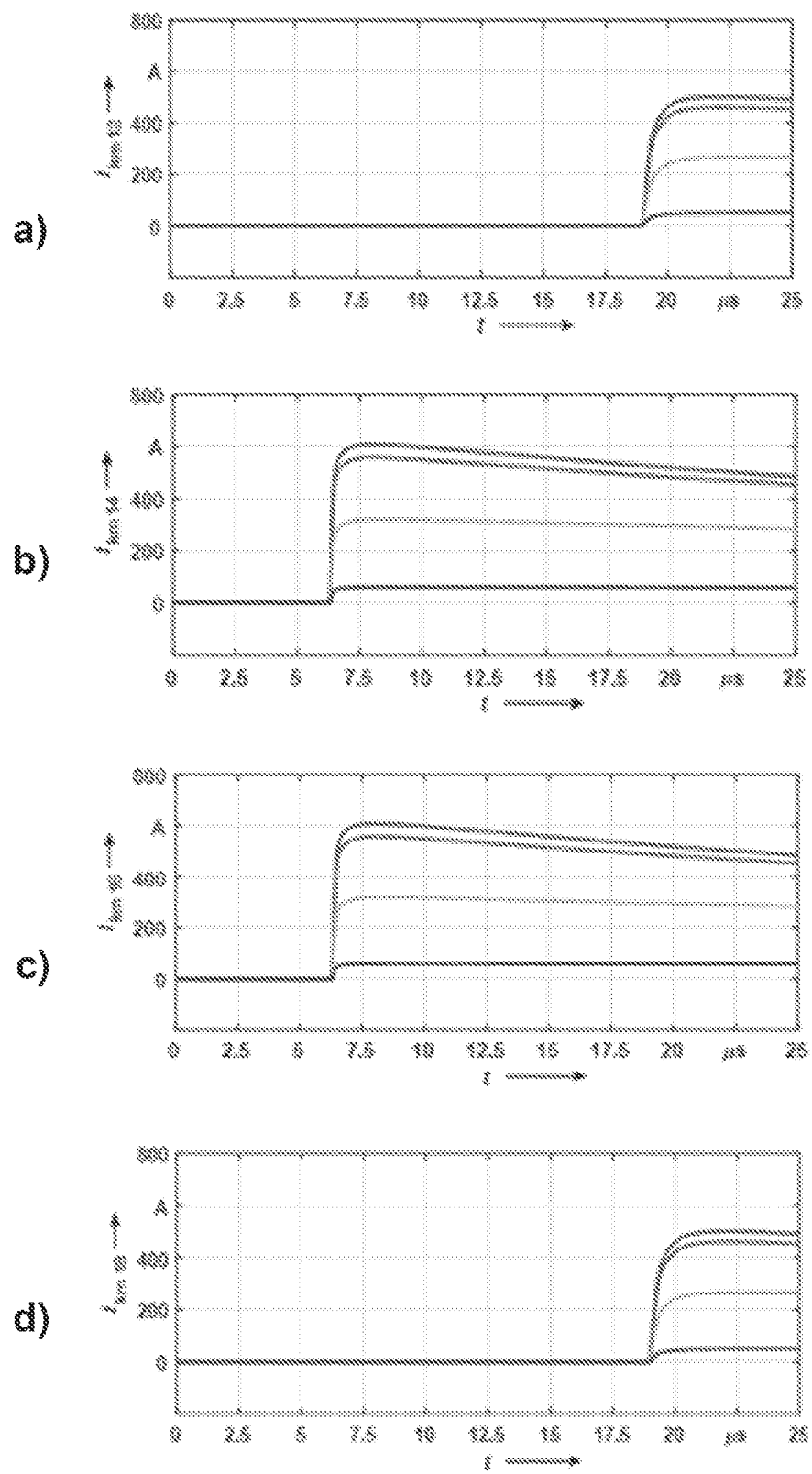
Figure 4:
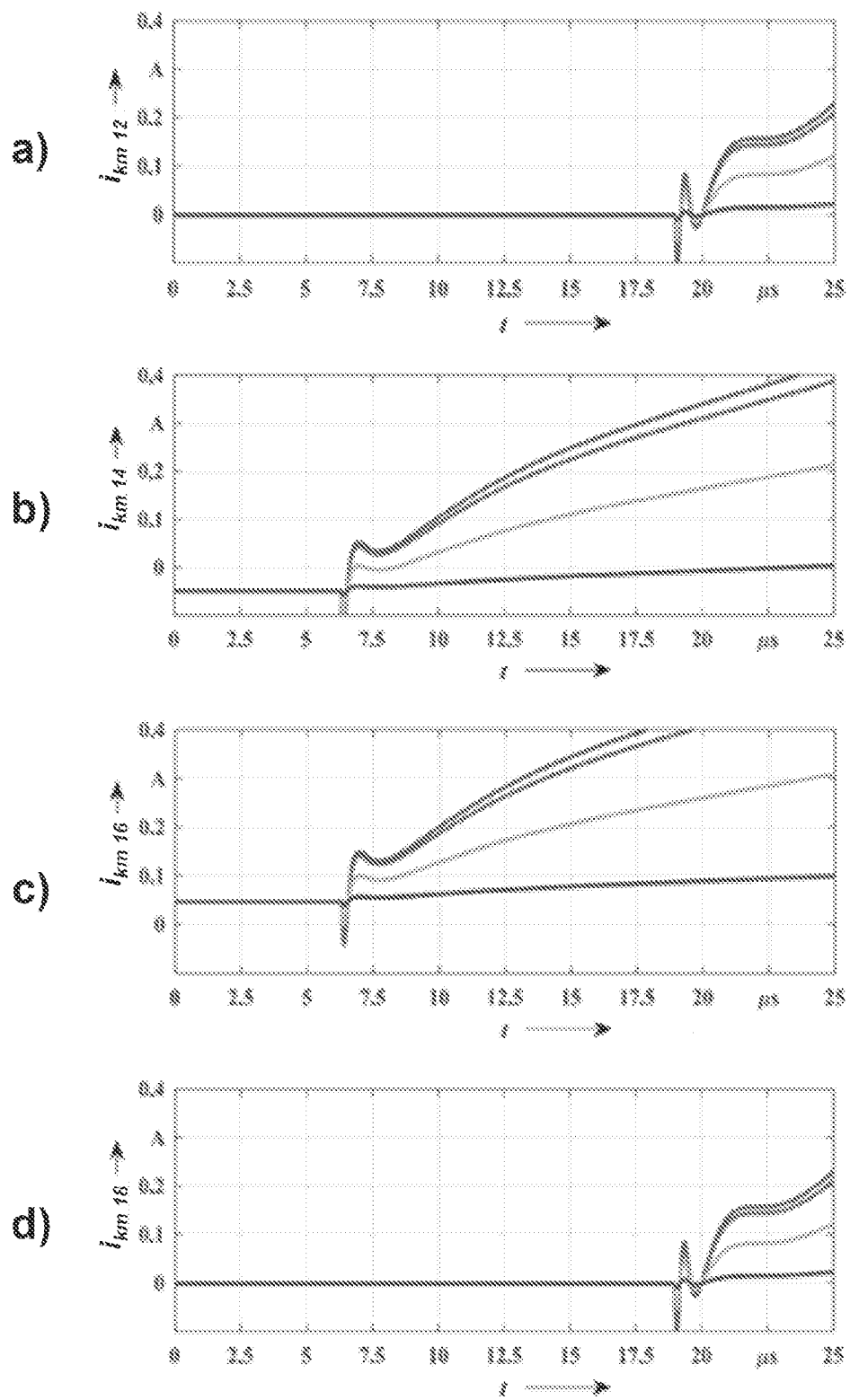

FIG. 2 shows a schematic illustration of an excerpt from a transmission link 200 for electrical energy with connection points 214 of cable segments arranged at a distance of 2 km and with a short circuit 216 between the conductor and the electrically conductive shield (not illustrated separately in the figure). The excerpt shows the region between km 12 and km 18 of the transmission link, and the short circuit 216 is at km 15. For the exemplary transmission link 200, the subsequent FIGS. 3 and 4 illustrate the currents—calculated in a simulation—in the shield and in the earth lines directly before and after the short circuit 216. It is assumed here that the link is 30 km in length, that is to say that the short circuit 216 is situated exactly in the centre of the transmission link 200, and the impedances of the shields and of the earthing lines on both sides of the short circuit 216 are identical.

FIG. 3 indicates the current profiles over time in the shields, said current profiles being calculated for measuring apparatuses arranged at the connection points 214 situated at km 12, km 14, km 16 and km 18. FIGS. 3 a)-3 d) indicate exemplary current profiles for short circuits with impedances of 0 ohms, 1 ohm, 10 ohms and 100 ohms, which are manifested in different amplitudes of the currents.

In FIG. 3 a), the absolute value of the current at km 12 is plotted against time, the time measurement beginning at 0 at the point in time of the short circuit. Correspondingly, in FIGS. 3 b)-3 d), the absolute values of the currents at km 14, km 16 and km 18 are plotted against time. It is readily discernible that the rise of the current at the respective measuring apparatuses takes place with a certain delay relative to the point in time of the short circuit. In the simulation, the short circuit is exactly in the centre of the transmission link, which is homogeneous in terms of its impedances, such that the points in time of the rises on both sides of the short circuit are identical in each case. The rise at the two measuring apparatuses situated in each case at a distance of 1 km, that is to say closest to the short circuit, takes place approximately 6.4 µs after the short circuit, while the rise at the measuring apparatuses situated in each case at a distance of 3 km takes place approximately 19 µs after the short circuit. The temporal delay is determined by the impedance of the electrically conductive shield, which is influenced inter alia by the arrangement, the dimensions and the electrical properties of the materials. From the temporal offset of the rise of the currents in the shield at different points, the known distance between the measuring apparatuses and the known impedance, the location of the short circuit can be determined therefrom.

A rise of the current above a threshold value, a typical profile of the current over time, or a combination of the two can be used in identifying a short circuit. Particularly in the case of comparatively high-impedance short circuits, such as e.g. a short circuit having an impedance of 100 ohms, which is represented by the bottom-most curve in each of the figures, the changing gradient of the current proceeding from the zero line can be used as a feature for recognizing a short circuit. Curve profiles can be provided as comparative patterns for a multiplicity of short-circuit impedances, or in one or more analytical expressions. In this case, it is readily evident that a high sampling rate when detecting the currents is advantageous for a high accuracy of the determination of the location of the short circuit.

FIG. 4 shows temporal profiles of the currents in earthing lines connecting the electrically conductive shield and earth at the connection points. As in FIG. 3, two measuring apparatuses are arranged in each case at a distance of 1 km from the short circuit, and two in each case at a distance of 3 km. The temporal offset is correspondingly identical. In FIGS. 4 $a$)-4 $d$) it is striking that the currents in the earthing lines are considerably smaller than the currents in the shield, which depends primarily on the impedances of the earth lines. The shape of the rise of the currents is different as well, such that here, if appropriate, the methods used for identifying a short circuit are different from those used in the monitoring of the current through the shield. What is of interest in this case is that at the moment when the short circuit becomes identifiable at the respective measuring apparatus, firstly a current flows from earth into the shield, which can be explained by compensation processes. This "negative" current flow can be used e.g. as an indication of a short circuit. However, a comparison of the profiles of the currents over time will yield sufficiently accurate results at this point as well. The location of the short circuit is determined in the same way as discussed with reference to FIG. 3.

In order to make the identification as reliable as possible, in each measuring apparatus it is possible to detect the current in the earthing line and the current in the shield. The monitoring of only one of the two currents can yield sufficiently accurate results depending on the properties of the cables and the earthing line.

Figure 5:
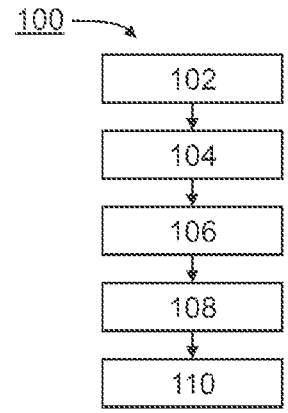
FIG. 5 shows an exemplary flow diagram of a method according to the invention.

FIG. 5 shows a schematic flow diagram of a method 100 according to the invention for localizing a short circuit between a conductor and an electrically conductive shield of a high-voltage cable, said shield surrounding said conductor. Step 102 involves providing at least two measuring apparatuses arranged at the high-voltage cable in each case at a known distance from one another or from the ends of the high-voltage cable and having timers, synchronized with one another, and a measuring device for detecting an electric current flowing in the electrically conductive shield and/or an electric current flowing in an earthing line connecting the electrically conductive shield and earth. In step 104, pairs of current measurement values and associated values of the timer are transmitted cyclically for mutually adjacent time segments or continuously from the measuring devices to an analysis unit. An analysis unit can be present in each measuring apparatus, or a plurality of measuring apparatuses can jointly use an analysis unit.

A continuous transmission to the analysis unit presupposes a sufficiently fast data connection. Therefore, this variant can preferably be used in an embodiment in which the analysis unit is part of the measuring apparatus, such that fast internal connections between the measuring device and the analysis unit can be used. A cyclic transmission of pairs of current measurement values and associated values of the timer can be advantageous if the analysis unit is not part of the measuring apparatus, but rather is used jointly by a plurality of measuring apparatuses. At least for the cyclic transmission, the pairs of current measurement values and associated values of the timer can be buffer-stored before they are transmitted collectively to the analysis unit. In order to minimize the volume of data to be transmitted, data compression methods can be used. In the analysis unit, the cyclically received data can be combined again to form a continuous measurement series, which is then analysed.

In step 106, the analysis unit feeds to a calculation unit, upon the occurrence of a current exceeding a threshold value and/or of a current profile over time that satisfies specific stipulations, at least in each case the associated value of the timer or the associated values of the timers, and also an indication about the location of the measurement. The value or values of the timer describe(s) the point in time at which the current profile over time in the shield varies such that the presence of a short circuit between the conductor and the shield can be deduced.

In step 108, the calculation unit calculates the location of the short circuit from the known distance between the measuring apparatuses and a difference between the values of the synchronized timers, and outputs said location in step 110.

Figure 6:
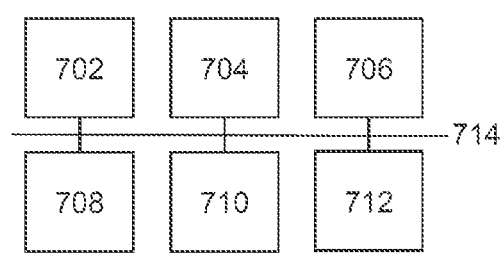
FIG. 6 shows a schematic block diagram of a measuring apparatus according to the invention.

FIG. 6 shows a schematic block diagram of a measuring apparatus 700 according to the invention for detecting an electric current flowing in the electrically conductive shield of a high-voltage cable and/or an electric current flowing in an earthing line connecting the electrically conductive shield and earth. The measuring apparatus comprises a current measuring device 702 for detecting the current in the electrically conductive shield and/or in the earthing line, and a timer 704, which is synchronizable with corresponding timers of other measuring apparatuses 700. The measuring apparatus additionally comprises a communication interface 706, which is configured for transmitting pairs of measurement values of the current measuring device 702 and of the timer 704 to an analysis unit 708' used by a plurality of measuring apparatuses 700 and/or which is configured for transmitting to a central calculation unit at least one value of the timer which is determined by an analysis unit 708 arranged in the measuring apparatus 700 and which corresponds to a point in time at which a current in the shield or in the earthing line, said current being caused by a short circuit between conductor and electrically conductive shield, flowed at the location of the measuring apparatus 700. The measuring apparatus furthermore comprises one or a plurality of microprocessors 710 and volatile and/or non-volatile memories 712 assigned thereto. The non-volatile memory can contain computer program instructions which, when executed by the microprocessor, cause the method according to the invention or parts of the method to be carried out. The elements of the measuring apparatus 700 can be connected to one another by one or a plurality of communication lines or buses 714.

Figure 7:
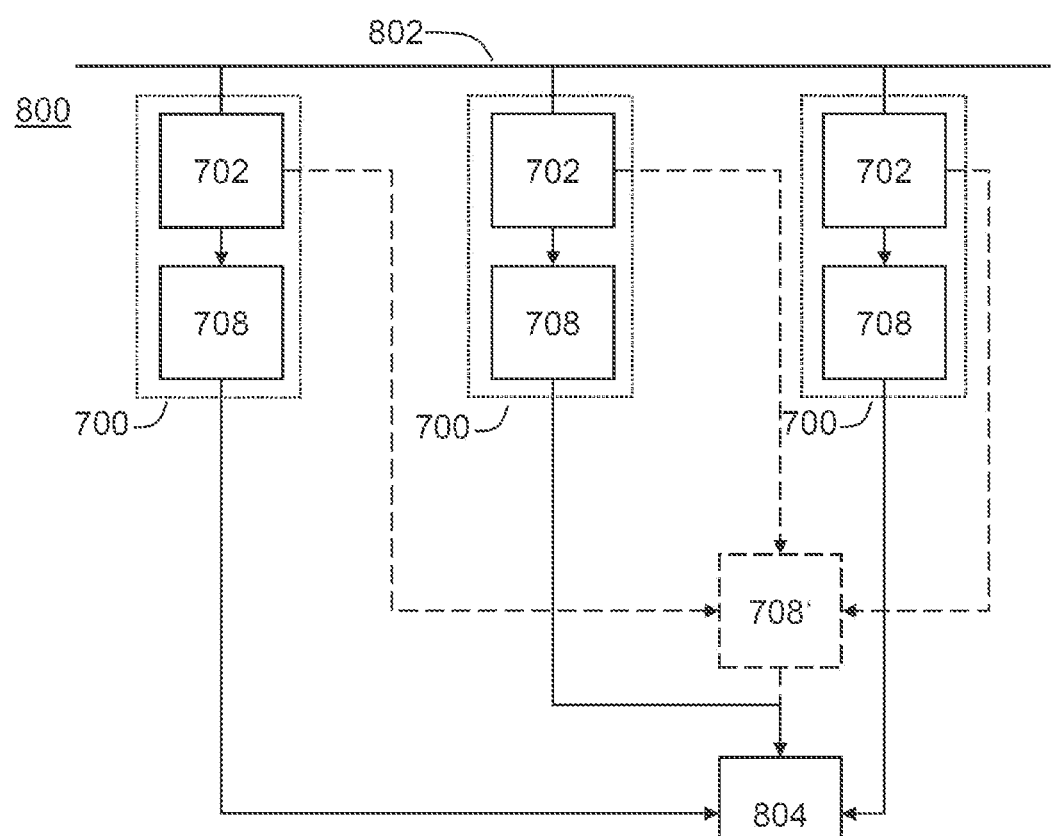
FIG. 7 shows a schematic block diagram of a system according to the invention.

FIG. 7 shows a schematic block diagram of a system 800 according to the invention having a plurality of measuring apparatuses 700 arranged along a high-voltage cable 802. The measuring apparatuses 700 have a current measuring device 702 and can have an analysis unit 708. Other elements of the measuring apparatus 700 are not illustrated, for reasons of clarity. The analysis units 708 of the measuring apparatuses 700 are communicatively connected to a central calculation unit 804.

If no dedicated analysis units 708 are provided in the measuring apparatuses 700, the measuring apparatuses 700 can also transmit the detected current measurement values and the associated points in time of measurement to a jointly used analysis unit 708', which is communicatively connected to the calculation unit 804. The optional use of an analysis unit 708' by a plurality of measuring apparatuses 700 is indicated by the dashed lines in the figure.

LIST OF REFERENCE SIGNS

100 Method
102-110 Method steps
200 Transmission link
200a-e Segments
202 Conductor
204 Shield
206 DC source
208 Internal resistance
209 Load resistance
210a-j Current measuring instrument
212a-f Earthing lines
700 Measuring apparatus
702 Current measuring device
704 Timer
706 Communication interface
708 Analysis unit
710 Microprocessor
712 Memory
714 Communication line/bus
800 System
802 High-voltage cable
804 Calculation unit

The invention claimed is:

1. A method for localizing a short circuit between a conductor and an electrically conductive shield of a high-voltage cable, said shield surrounding said conductor, comprising:
providing at least two measuring apparatuses arranged at the high-voltage cable in each case at a known distance from one another or from the ends of the high-voltage cable and having timers, synchronized with one another, and a measuring device for detecting an electric current flowing in the electrically conductive shield and/or an electric current flowing in an earthing line connecting the electrically conductive shield and earth,
transmitting, cyclically for mutually adjacent time segments or continuously, pairs of current measurement values and associated values of the timer, from the measuring devices to an analysis unit,
feeding, from the analysis unit to a calculation unit, upon the occurrence of a current exceeding a threshold value and/or of a current profile over time that satisfies specific stipulations, at least in each case the associated value of the timer or the associated values of the timers and also an indication about the location of the measurement, for which first effects of the short circuit occurred at the location of the measurement,
calculating, in the calculation unit, the location of a short circuit from the known distance between the measuring apparatuses and a difference between the values of the synchronized timers, and
outputting the calculated location.

2. The method according to claim 1, additionally comprising:
comparing, in the analysis unit, a current profile over time with a multiplicity of locally stored reference current profiles over time, and
deriving a point in time of the occurrence of the first effects of a short circuit at the location of the measurement.

3. The method according to claim 1, additionally comprising:
feeding values representing the impedance of the electrically conductive shield and/or the impedance of the earthing line connecting the electrically conductive shield and earth for each measuring apparatus to the calculation unit for calculating (108) the location.

4. The method according to claim 1, additionally comprising:
synchronizing the timers of the measuring apparatuses by means of the signals of a satellite navigation system, of a time signal transmitter for radio-controlled clocks and/or synchronization signals transmitted via a communication line connecting the measuring points.

5. A measuring apparatus for detecting an electric current flowing in the electrically conductive shield of a high-voltage cable and/or an electric current flowing in an earthing line connecting the electrically conductive shield and earth, comprising:
a current measuring device for detecting the current in the electrically conductive shield and/or in the earthing line,
a timer, which is synchronizable with timers of other measuring apparatuses,
a communication interface, which is configured for transmitting pairs of measurement values of the current measuring device and of the timer to an analysis unit used by a plurality of measuring apparatuses and/or which is configured for transmitting to a central calculation unit at least one value of the timer which is determined by an analysis unit arranged in the measuring apparatus and which corresponds to a point in time at which effects of a short circuit between conductor and electrically conductive shield occurred for the first time in the shield or in the earthing line at the location of the measuring apparatus,
one or a plurality of microprocessors and volatile and/or non-volatile memories assigned thereto.

6. The measuring apparatus according to claim 5, wherein the timers are synchronized with one another by means of signals of a satellite navigation system, synchronization signals of a highly precise radio-controlled clock and/or synchronization signals transmitted via a communication line connecting the measuring apparatuses.

7. A system for localizing a short circuit between a conductor and an electrically conductive shield of a high-voltage cable, said shield surrounding said conductor, comprising:
at least two measuring apparatuses arranged at the high-voltage cable in each case at a known distance from one another or from the ends of the high-voltage cable and having timers, synchronized with one another, and a measuring device for detecting an electric current flowing in the electrically conductive shield and/or an electric current flowing in an earthing line connecting the electrically conductive shield and earth, and said measuring apparatuses being configured to transmit pairs of current measurement values and associated values of the timer cyclically for mutually adjacent time segments or continuously to an analysis unit, at least one analysis unit configured to analyse the transmitted pairs of current measurement values and associated values of the timer and, upon the occurrence of a current exceeding a threshold value or of a current profile over time that satisfies specific stipulations, to determine a point in time at which first effects of the short circuit occurred at the respective measuring apparatus, and to feed in each case the determined point in time to a calculation unit, a calculation unit configured to localize the location of the short circuit from the known distance between the measuring apparatuses and a difference between the fed points in time.

8. The system according to claim 7, wherein the calculation unit is configured to take as a basis for the calculation the impedance of the cable shield and/or of earthing lines connecting the electrically conductive shield and earth and also the respective location thereof along the cable.

9. The transmission link for electrical energy of high voltage having a high-voltage cable, which comprises an electrical conductor and an electrically conductive shield surrounding the electrical conductor, and a system for localizing a short circuit between the conductor and the electrically conductive shield according to claim 7.

10. The transmission link according to claim 9, wherein the conductors or the shields of a plurality of high-voltage cables are connected to one another, and wherein measuring apparatuses are arranged at connection points of the high-voltage cables and/or at the end points of the transmission link, said measuring apparatuses comprising:

a current measuring device for detecting the current in the electrically conductive shield and/or in the earthing line, a timer, which is synchronizable with timers of other measuring apparatuses, a communication interface, which is configured for transmitting pairs of measurement values of the current measuring device and of the timer to an analysis unit used by a plurality of measuring apparatuses and/or which is configured for transmitting to a central calculation unit at least one value of the timer which is determined by an analysis unit arranged in the measuring apparatus and which corresponds to a point in time at which effects of a short circuit between conductor and electrically conductive shield occurred for the first time in the shield or in the earthing line at the location of the measuring apparatus, one or a plurality of microprocessors and volatile and/or non-volatile memories assigned thereto.

* * * * *